United States Patent
Kikinis

[11] Patent Number: 6,094,351
[45] Date of Patent: Jul. 25, 2000

[54] UNIVERSAL ENCLOSURE FOR DIFFERENT TYPE MOTHER BOARDS

[75] Inventor: Dan Kikinis, Saratoga, Calif.

[73] Assignee: Hon Hai Precision Ind. Co., Ltd., Taipei Hsien, Taiwan

[21] Appl. No.: 09/136,495

[22] Filed: Aug. 19, 1998

[51] Int. Cl.[7] .................................................. H05K 5/00
[52] U.S. Cl. .......................... 361/752; 361/752; 361/683; 361/684; 361/685; 361/686; 361/728; 361/729; 361/736; 361/784; 361/785; 361/788; 361/796; 361/801; 361/802; 361/807
[58] Field of Search ................................. 361/683–684, 361/728–810

[56] References Cited

U.S. PATENT DOCUMENTS

| | | | |
|---|---|---|---|
| 5,442,520 | 8/1995 | Kemp et al. | 361/785 |
| 5,740,020 | 4/1998 | Palatov | 361/796 |
| 5,774,343 | 6/1998 | Benson et al. | 361/796 |
| 5,793,616 | 8/1998 | Aubuchon et al. | 361/784 |
| 5,923,531 | 7/1999 | Bachman et al. | 361/690 |

*Primary Examiner*—Leo P. Picard
*Assistant Examiner*—Tuan Dinh

[57] ABSTRACT

A universal enclosure system in a tower type manner for receiving different type mother boards therein includes the main body generally having at least a top wall, a bottom wall, a first and a second side walls, a front panel. Two kinds of different removable back panels are interchangeably adopted to cooperate with the main body for exclusively receiving a first type mother board, i.e., the ATX type, or a second type mother board, i.e., the NLX type, in the enclosure system wherein the first type mother board is bigger than the second type mother board. The first back panel cooperates with a first metal carrier which is adapted to mount the first type mother board thereon whereby the first type mother board is positioned in the interior of the enclosure system and almost very close to the first side wall. Alternatively, the second type back panel cooperates with a second metal carrier which is adapted to mount the second type mother board thereon whereby the second type mother board is positioned in the interior of the enclosure system and generally in the middle portion thereof.

10 Claims, 4 Drawing Sheets

UNIVERSAL ENCLOSURE FOR DIFFERENT TYPE MOTHER BOARDS

BACKGROUND OF THE INVENTION

1. Field of the Invention

The invention relates to an arrangement of an enclosure for use with the computer set which is adapted to receive different type mother boards therein.

2. The Relates Art

Generally speaking, there are two types mother boards for use with the personal computer set in the industry field. One type is ATX in which the mother board with a metal carrier and the associated removable back panel section is installed into the interior of the computer enclosure from the back under the condition that the mother board is substantially closely spaced from the wall of the enclosure for reserving the sufficient space above the mother board whereby a plurality of expansion cards can be electrically and mechanically connected to the mother board through a corresponding expansion slot card edge connectors which are directly mounted on the mother board. Under this situation, such expansions cards are positioned in a vertical relationship with regard to the mother board.

The other type is NLX which wherein similar to the ATX type, the mother board of NLX type also with a metal carrier and the associated removal side panel is installed into the interior of the enclosure from one side under the condition that the mother board is substantially closely spaced from the wall of the enclosure. Different from the ATX type, the mother board of the NLX type provides a larger riser card which is electrically and mechanically connected to the mother board through a longer card edge connector receiving a front end edge of the mother board. Correspondingly, a plurality of expansion slot connectors are mounted on the mother board for receiving a corresponding number of expansion cards therein whereby such expansion cards are positioned above the mother board in a parallel relationship. Under this situation, the I/O port section of the mother board is positioned on the left side of the mother board for alignment with the corresponding bracket section on the backpanel. It is also noted that because the NLX type mother board uses the riser card having plural expansion slots thereabove for connection to the plural expansion cards, the dimension of the mother board can be significantly reduced to an amount and leave some space on the other side portion of the interior of the enclosure for adoption of drives or CD ROM therein.

Generally speaking, because the dimensions, the arrangements and the installation ways of the ATX type and the NLX type mother boards are totally different with each other, the corresponding enclosures for use with the ATX type and the NLX type mother boards are also different with each other. In other words, the enclosures of these two different two types can not be compatible with each other or share some portions with each other during manufacturing or assembling by consideration of cost down. As known, the aforementioned conventional enclosures for use with the ATX type mother board or the NLX type mother board all have this shortcoming either for a desktop type application or a tower type application.

Therefore, an object of the invention is to provide a universal enclosure system which is adapted to interchangeably receive a ATX type or a NLX type mother board therein.

SUMMARY OF THE INVENTION

According to an aspect of the invention, a universal enclosure system in a tower type manner for receiving different type mother boards therein includes the main body generally having at least a top wall, a bottom wall, a first and a second side walls, a front panel. Two kinds of different removable back panels are interchangeably adopted to cooperate with the main body for exclusively receiving a first type mother board, i.e., the ATX type, or a second type mother board, i.e., the NLX type, in the enclosure system wherein the first type mother board is bigger than the second type mother board. The first back panel cooperates with a first metal carrier which is adapted to mount the first type mother board thereon whereby the first type mother board is positioned in the interior of the enclosure system and almost very close to the first side wall. Alternatively, the second type back panel cooperates with a second metal carrier which is adapted to mount the second type mother board thereon whereby the second type mother board is positioned in the interior of the enclosure system and generally in the middle portion thereof.

Additionally, the first type mother board, which is closer to the first side wall, faces to the second side wall; on the contrary, the second type mother board, which is positioned in the middle of the interior in the enclosure system, faces to the first side wall.

DETAILED DESCRIPTION OF THE PREFERRED EMBODIMENT

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention.

Figure 1:
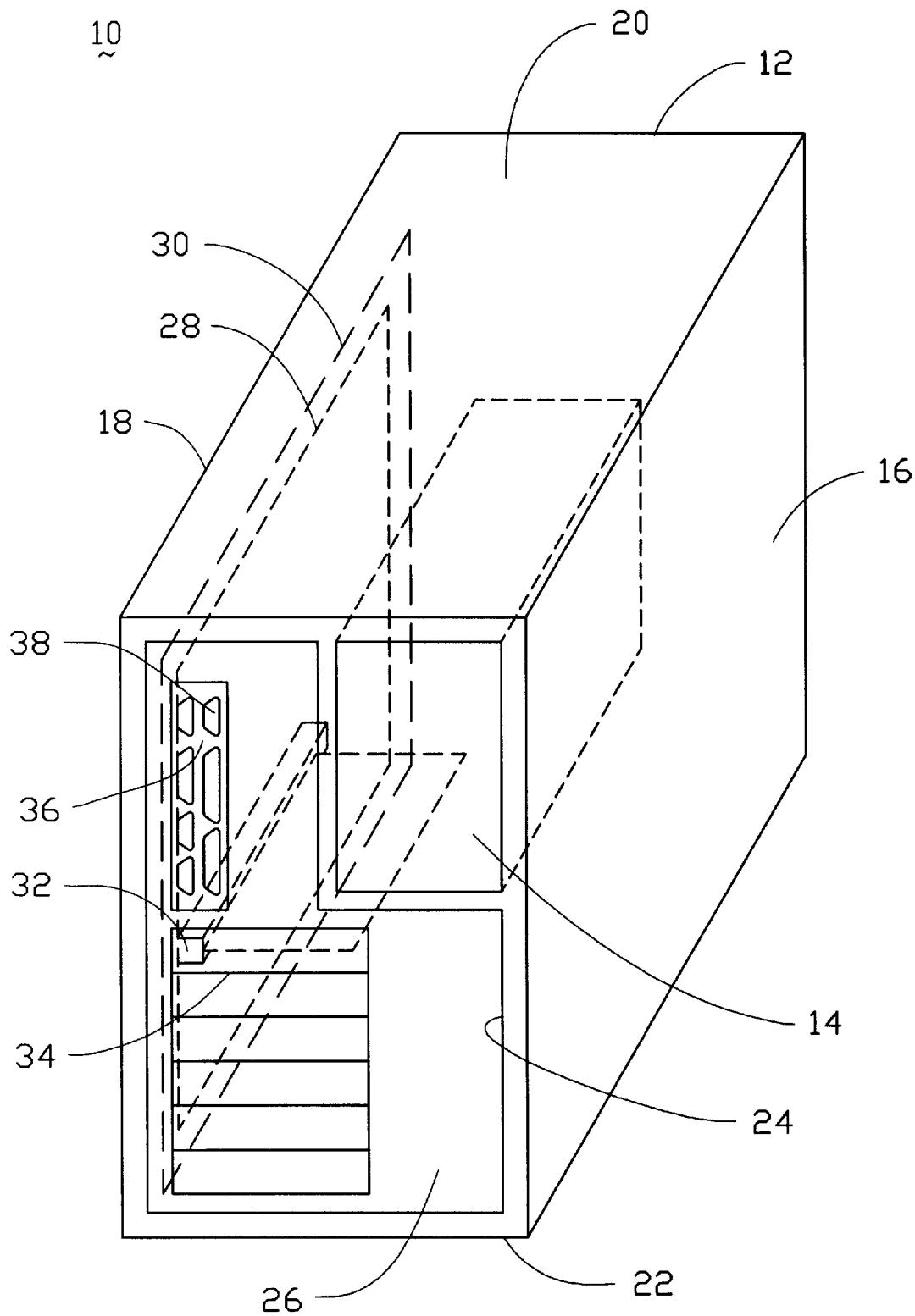
FIG. 1 is a rear perspective view of a preferred embodiment of a universal enclosure system for use with a personal computer to show how an ATX type mother board is received therein, according to the invention.
Figure 2:
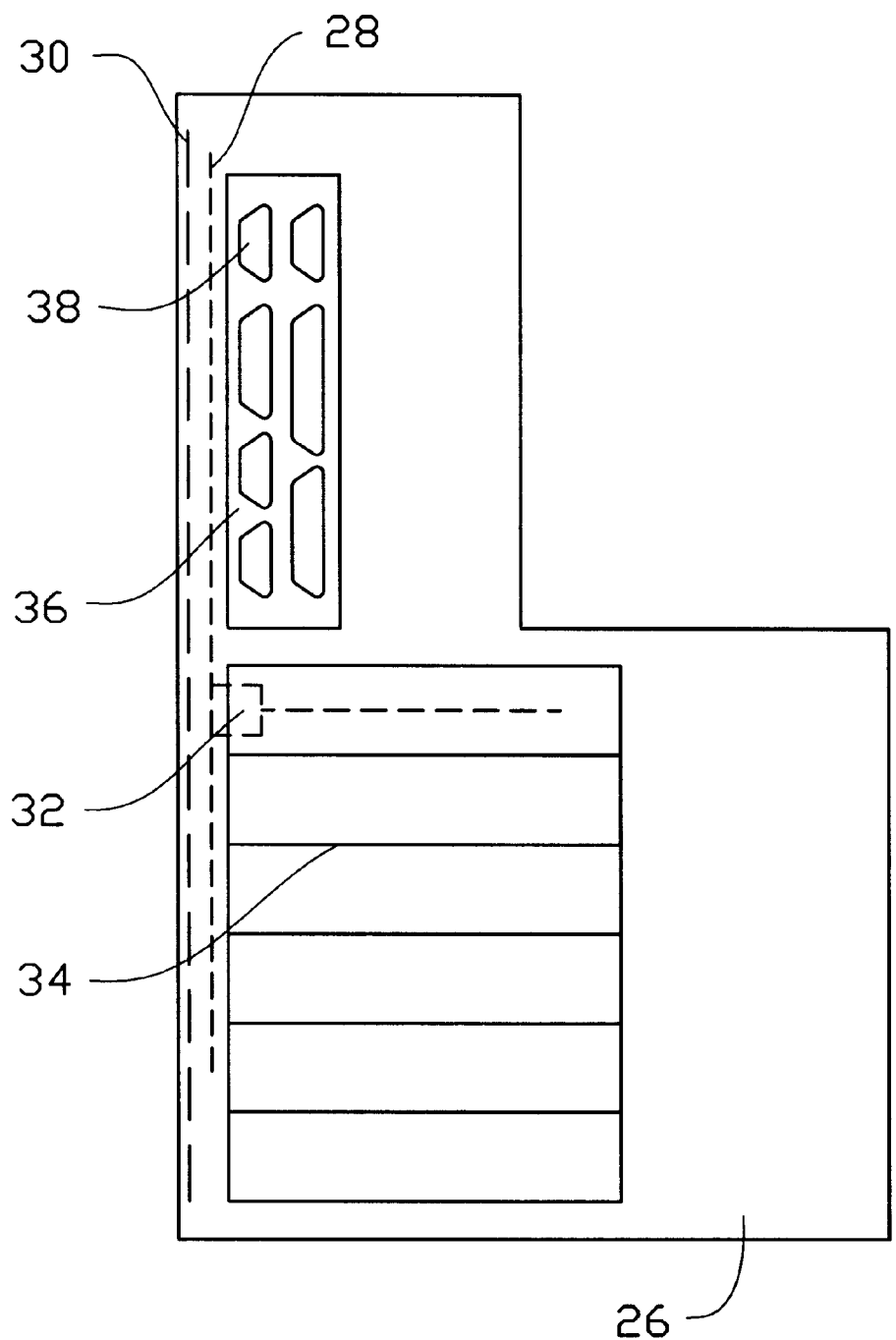
FIG. 2 is a rear side view of first type removable back panel of the enclosure system of FIG. 1 to show how the ATX type mother board cooperates therewith.
Figure 3:
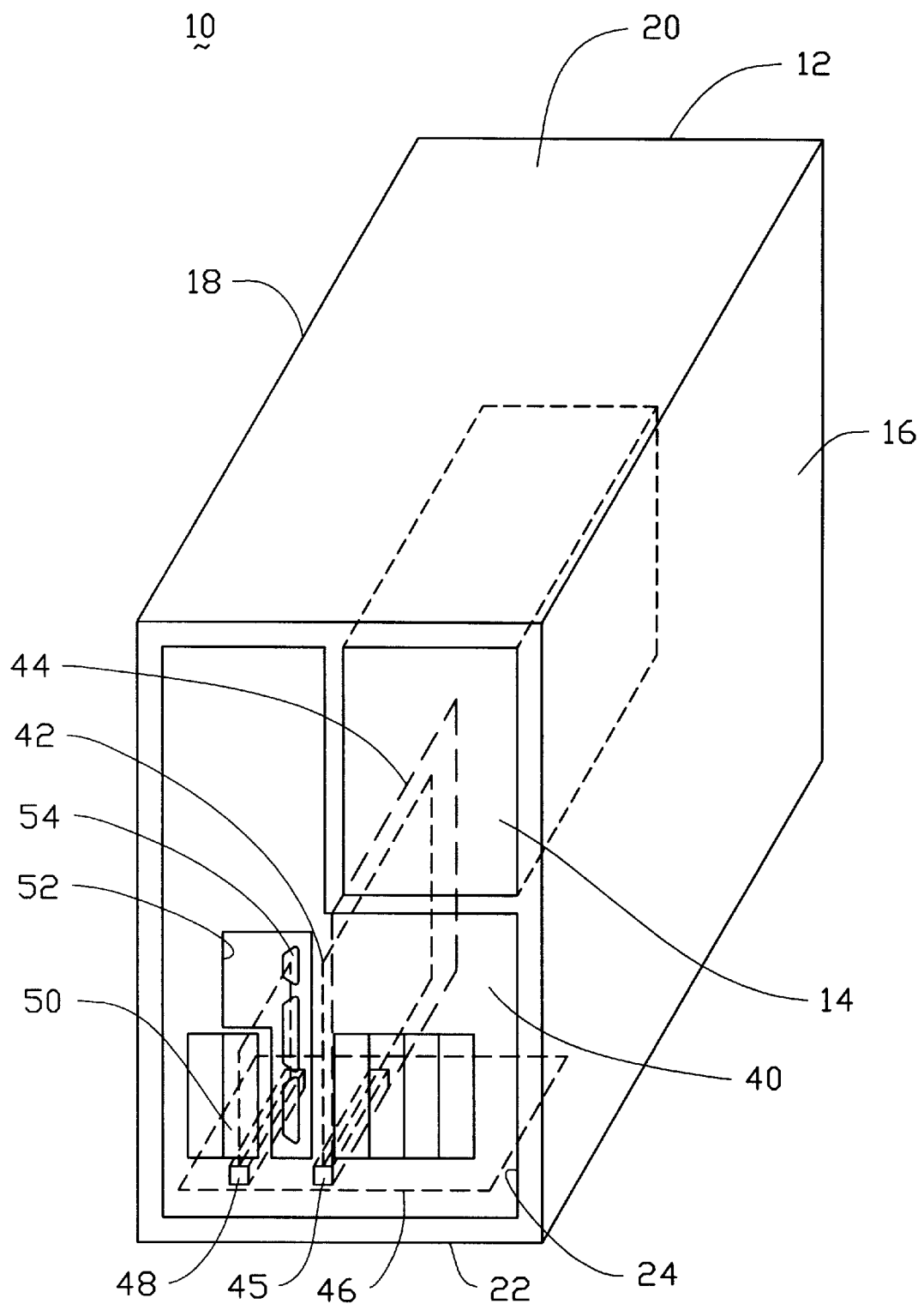
FIG. 3 is a rear perspective view of the universal enclosure system of FIG. 1 to show how an NLX type mother board is received therein.
Figure 4:
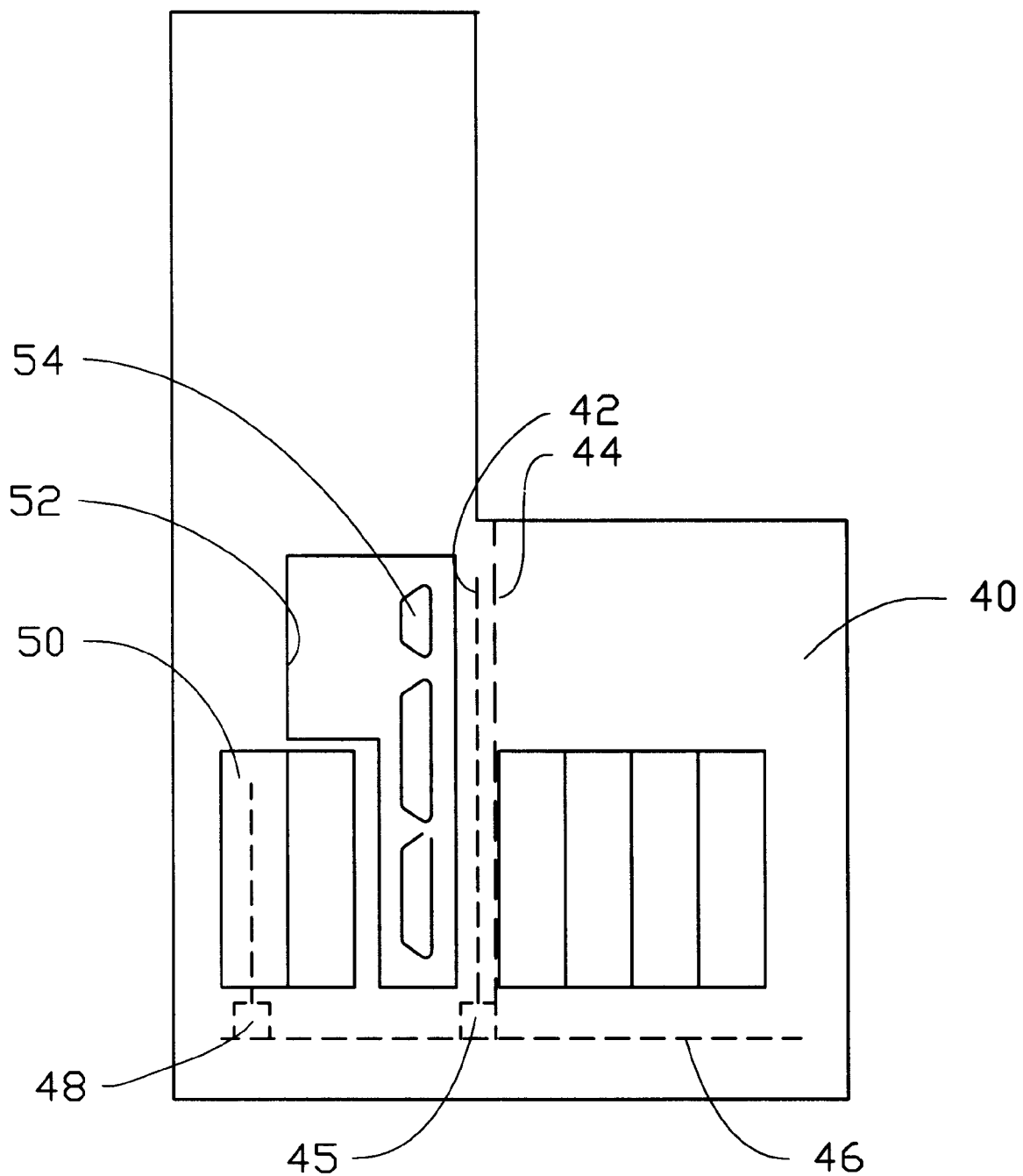
FIG. 4 is a rear side view of the second type removable back panel of the enclosure system of FIG. 3 to show how the NLX type mother board cooperates therewith.

It will be noted here that for a better understanding, most of like components are designated by like reference numerals throughout the various figures in the embodiments. Attention is directed to FIGS. 1 and 2 wherein a universal enclosure system 10 generally defining rectangular configuration having a first face 12, a second face (rear) 14 opposite to the first (front) face 12, a third (left) face 16, a fourth (right) face 18 opposite to the third face 16, a fifth (top) face 20 and a six (bottom) face 22 opposite to the fifth face 20.

The second face 14 includes an large opening 24 providing the passage for allowing installation of the mother board within the interior of the enclosure system 10.

A first type removable back panel 26 for use with a first type or an ATX type mother board 28, has a first contour complies with the opening 24. A first metal carrier 30 is fastened to left side edge of the back panel 26 (from a rear viewpoint) in a perpendicular relationship, and the first type, i.e., the ATX type mother board 28, can abut against and be aligned with the first metal carrier 30. A plural of expansion slot card edge connectors 32 are mounted on the first type mother board 28 so that when the back panel 26 and the corresponding metal carrier 30 with the associated first type mother board 28 are assembled to the enclosure system 10 from the back, the first type mother board 28 is very closer to the fourth face 18 and the expansion slot connectors 32 face to the third face 16.

The first type back panel 26 further includes a plurality of slot brackets 34 in alignment with the expansion slot connectors 32, and an I/O opening section 36 in alignment with a corresponding I/O port section 38 of the first type mother board 28.

A second type removable back panel 40 for use with a second type or an NLX type mother board 42, has a second contour similar to the first contour of the first type back panel 26. A second metal carrier 44 is fastened to the middle portion of the back panel 40 in a perpendicular relationship, and the second type mother board 42 can abut against and be aligned with the second metal carrier 44. A riser card 46 is perpendicularly positioned below the second type mother board 42 and connected to the second type mother board 42 through a card edge connector 45 positioned on the middle portion of the riser card 46 so that the plural expansion slot card edge connectors 48 mounted on the riser card 46, are generally positioned by two sides of the second type mother board 42.

The second type removable back panel 40 further includes a plurality of slot brackets 50 for alignment with the expansion slot connectors 48 on the riser card 46, and an I/O opening section 52 in alignment with a corresponding I/O port section 54 of the second type mother board 42.

It can be understood that the main feature of the invention is to provide a universal enclosure system which includes two interchangeable back panels 26 and 40 incorporating the main six faces structure thereof for exclusively and respectively operatively receiving either the first type ATX mother board 28 or the second type NLX mother board 42. To implement this object, several changes have been applied to the original arrangement of the NLX type mother board and the corresponding mechanism of the conventional NLX type computer set.

First, similar to the ATX computer, the conventional NLX computer generally has its mother board positioned closer to one face wall and has the corresponding riser card positioned adjacent to the center portion of the interior of the enclosure. Differently, because the enclosure system 10 of the invention provides the basic structure to meet commonly the ATX type mother board 28 and the NLX type mother board 42, and there is no sufficient space to have the riser card 46 still positioned around the center portion of the interior of the enclosure, the riser card 46 is positioned closely adjacent to one face, i.e., the rear face 14. Thus, there will be no interference between the riser card 46 with the other structures within the enclosure system.

Correspondingly, the mother board 42 is generally positioned on the middle portion of the riser card 46, and this is also different from that of the conventional arrangement which has the mother board and the riser card form a L-shaped configuration, while the present invention has the mother board 42 and the riser card 46 form a T-shaped configuration.

Additionally, because the I/O port section 54 of the mother board 42 has its specific position thereon and should be open to the rear side, it is required to have the I/O port section 54 face to the right face 18 opposite to the I/O port section 38 facing to the rear face 16, when the front edge of the mother board 42 is connected to the card edge connector 45 adjacent the rear face 14. It can be deemed that the mother board 42 in the invention is an upside-down arrangement with regard to the enclosure in comparison with the conventional type.

Further more, in other embodiment, the top face 20 can be removed from the whole structure for directly withdrawal of the mother board therein without removal of the removable back panel 40.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

I claim:

1. An enclosure system for selectively mounting two types of mother boards, comprising:

a first face;

a second face opposite to said first face including an opening therein;

a first removable panel having a first carrier mounted aside said first removable panel with a first type mother board mounted thereto; and a second removable panel having a second carrier mounted to a middle portion of said second removable panel with a second type mother board mounted thereto; wherein said first removable panel and said second removable panel interchangeably mounted to said second face to cover said opening whereby said first carrier and said second carrier selectively extend through said opening and selectively position said first type mother board at a corresponding first location and said second type mother board at a corresponding second location.

2. The enclosure system as described in claim 1, wherein said first type mother board abuts against and is aligned with said first carrier.

3. The enclosure system as described in claim 2, wherein said first type mother board has at least one card edge connector mounted thereon for insertion of corresponding expansion cards in a vertical relationship to said first type mother board.

4. The enclosure system as described in claim 1, wherein said second type mother board abuts against and is aligned with said second carrier.

5. The enclosure system as described in claim 4, wherein said second type mother board connects to a daughter board having at least one card edge connector mounted thereon for insertion of corresponding expansion cards in a horizontal relationship to said second type mother board.

6. An arrangement for selectively mounting two types of mother boards, comprising:

providing an enclosure including a first face and a second face opposite to said first face and having an opening;

providing a first removable panel having a first carrier mounted aside said first removable panel with a first type mother board mounted thereto; and providing a second removable panel having a second carrier mounted to a middle portion of said second removable panel with a second type mother board mounted thereto; wherein selectively mounting one of said first removable panel and said second removable panel to said second face to cover said opening results in said first carrier or said second carrier selectively extending through said opening and selectively positioning said first type mother board at a corresponding first location or said second type mother board at a corresponding second location.

7. The arrangement as described in claim 6, wherein said first type mother board abuts against and is aligned with said first carrier.

8. The arrangement as described in claim 7, wherein said first type mother board has at least one card edge connector mounted thereon for insertion of corresponding expansion cards in a vertical relationship to said first type mother board.

9. The arrangement as described in claim 6, wherein said second type mother board abuts against and is aligned with said second carrier.

10. The arrangement as described in claim 9, wherein said second type mother board connects to a daughter board having at least one card edge connector mounted thereon for insertion of corresponding expansion cards in a horizontal relationship to said second type mother board.

* * * * *